(12) United States Patent
Xu et al.

(10) Patent No.: US 12,089,354 B2
(45) Date of Patent: Sep. 10, 2024

(54) FOLDABLE DISPLAY APPARATUS AND ELECTRONIC DEVICE

(71) Applicant: BOE Technology Group Co., Ltd., Beijing (CN)

(72) Inventors: Linlin Xu, Beijing (CN); Bo Wang, Beijing (CN); Yanli Wang, Beijing (CN); Wei Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 197 days.

(21) Appl. No.: 17/785,927

(22) PCT Filed: Aug. 4, 2021

(86) PCT No.: PCT/CN2021/110493
§ 371 (c)(1),
(2) Date: Jun. 16, 2022

(87) PCT Pub. No.: WO2022/052679
PCT Pub. Date: Mar. 17, 2022

(65) Prior Publication Data
US 2023/0020569 A1      Jan. 19, 2023

(30) Foreign Application Priority Data
Sep. 9, 2020   (CN) .......................... 202010942401.4

(51) Int. Cl.
*H05K 5/00*    (2006.01)
*F16C 11/04*   (2006.01)
*H05K 5/02*    (2006.01)

(52) U.S. Cl.
CPC ............ *H05K 5/0226* (2013.01); *F16C 11/04* (2013.01)

(58) Field of Classification Search
None
See application file for complete search history.

(56) References Cited

U.S. PATENT DOCUMENTS 7,032,984 B2 * 4/2006 Kim .......................... G09F 9/30
                                                                49/383
10,120,421 B1 * 11/2018 Hong ................... G06F 1/1681
2020/0037458 A1    1/2020 Si
(Continued)

FOREIGN PATENT DOCUMENTS

CN   105048412 A   11/2015
CN   204785522 U   11/2015
(Continued)

OTHER PUBLICATIONS

International Search Report for PCT/CN2021/110493 Mailed Nov. 8, 2021.

*Primary Examiner* — Anthony Q Edwards
*Assistant Examiner* — Rashen E Morrison
(74) *Attorney, Agent, or Firm* — Ling Wu; Stephen Yang; Ling and Yang Intellectual Property

(57) ABSTRACT

A foldable display apparatus includes a first shell (10), a second shell (20), a rotating shaft assembly, and a rotating shaft protection member (30); the rotating shaft assembly is located between the first shell (10) and the second shell (20) and connected to each of the first shell (10) and the second shell (20); the rotating shaft protection member (30) covers the rotating shaft assembly; the rotating shaft protection member (30) is made of a shape-memory alloy.

20 Claims, 8 Drawing Sheets

(56) References Cited

U.S. PATENT DOCUMENTS

2020/0103935 A1  4/2020  Hsu
2020/0348733 A1  11/2020  Ju et al.

FOREIGN PATENT DOCUMENTS

| CN | 108712538 A | 10/2018 |
| CN | 109469680 A | 3/2019 |
| CN | 208737800 U | 4/2019 |
| CN | 208922657 U | 5/2019 |
| CN | 110138916 A | 8/2019 |
| CN | 110769090 A | 2/2020 |
| CN | 210295055 U | 4/2020 |
| CN | 111882996 A | 11/2020 |
| CN | 212411485 U | 1/2021 |

* cited by examiner

FOLDABLE DISPLAY APPARATUS AND ELECTRONIC DEVICE

CROSS-REFERENCE TO RELATED APPLICATION

This application is a national stage application of PCT Application No. PCT/CN2021/110493, which is filed on Aug. 4, 2021, entitled "Foldable Display Apparatus and Electronic Device", and claims priority to Chinese Patent Application No. 202010942401.4, filed to the China National Intellectual Property Administration on Sep. 9, 2020, the content of which should be regarded as being incorporated herein by reference.

TECHNICAL FIELD

The present disclosure relates to the field of display technology, in particular to a foldable display apparatus and an electronic device.

BACKGROUND

With the continuous development of display technology, various types of display apparatuses are constantly emerging, foldable display apparatuses are more and more popular with audiences because of their various modes of use.

The foldable display apparatus generally connects structures on both sides of the foldable display apparatus by a rotating shaft assembly to realize folding. Generally, the structural appearance of the rotating shaft assembly generally is quite difference from that of two sides of the rotating shaft assembly. In order to protect the rotating shaft assembly, the foldable display apparatus is also disposed with a rotating shaft protection member.

SUMMARY

The following is a summary about subject matters described herein in detail. The summary is not intended to limit the protection scope of claims.

In a first aspect, the present disclosure provides a foldable display apparatus, including: a first shell, a second shell, a rotating shaft assembly, and a rotating shaft protection member; the rotating shaft assembly is located between the first shell and the second shell, and is respectively connected with the first shell and the second shell; the rotating shaft protection member covers the rotating shaft assembly; herein, the rotating shaft protection member is made of a shape-memory alloy.

In some possible implementations, bent states of the foldable display apparatus include an inward folded state and an outward folded state, and when the foldable display apparatus is in different bent states, the rotating shaft protection member assumes different bulk phase states.

The bulk phase states include an austenitic phase and a martensitic phase.

In some possible implementations, when the bent state of the foldable display apparatus is an inward folded state, the rotating shaft protection member assumes an austenitic phase; and when the bent state of the foldable display apparatus is an outward folded state, the rotating shaft protection member assumes a martensitic phase.

In some possible implementations, the shape-memory alloy includes an iron-nickel alloy material or a titanium-nickel alloy material.

In some possible implementations, it also includes: a flexible display assembly; the flexible display assembly includes: a display surface and a non-display surface disposed oppositely; the first shell, the second shell, and the rotating shaft assembly are positioned on the non-display surface of the flexible display assembly.

In some possible implementations, the rotating shaft protection member is adhesively connected with each of the first shell and the second shell.

In some possible implementations, when the foldable display apparatus is in a bent state, the rotating shaft protection member assumes a U-shaped structure.

In some possible implementations, when the foldable display apparatus is in an inward folded state, the rotating shaft protection member includes a first bent part, a first non-bent part, and a second non-bent part; the first non-bent part and the second non-bent part are respectively positioned on two sides of the first bent part, and are disposed in parallel; when the foldable display apparatus is in an outward folded state, the rotating shaft protection member includes a second bent part, a third non-bent part, and a fourth non-bent part; the third non-bent part and the fourth non-bent part are respectively positioned on two sides of the second bent part, and are disposed in parallel; a bending degree of the first bent part is smaller than a bending degree of the second bent part; a distance between the first non-bent part and the second non-bent part is greater than a distance between the third non-bent part and the fourth non-bent part.

In some possible implementations, the rotating shaft assembly includes a center beam structure; the rotating shaft protection member covers the center beam structure, and a shape of the first bent part of the rotating shaft protection member is adapted to a shape of the center beam structure.

In some possible implementations, the rotating shaft protection member is a solid structure.

In some possible implementations, the rotating shaft protection member is a hollow structure.

In some possible implementations, the rotating shaft protection member includes multiple tube bodies which are interconnected; at least one tube body is in a hollow structure.

In some possible implementations, multiple tube bodies are in an integrally molded structure.

In some possible implementations, a cross-sectional shape of the at least one tube body includes one of a triangle, a rectangle, a trapezoid, or a ring consisting of two semicircles and two straight lines.

In some possible implementations, cross-sectional shapes of all the tube bodies in the rotating shaft protection member are same.

In a second aspect, the present disclosure also provides an electronic device, including the above foldable display apparatus.

After reading and understanding the drawings and the detailed description, other aspects may be understood.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, and do not form a limitation on the technical solutions of the present disclosure.

DETAILED DESCRIPTION

Figure 1:
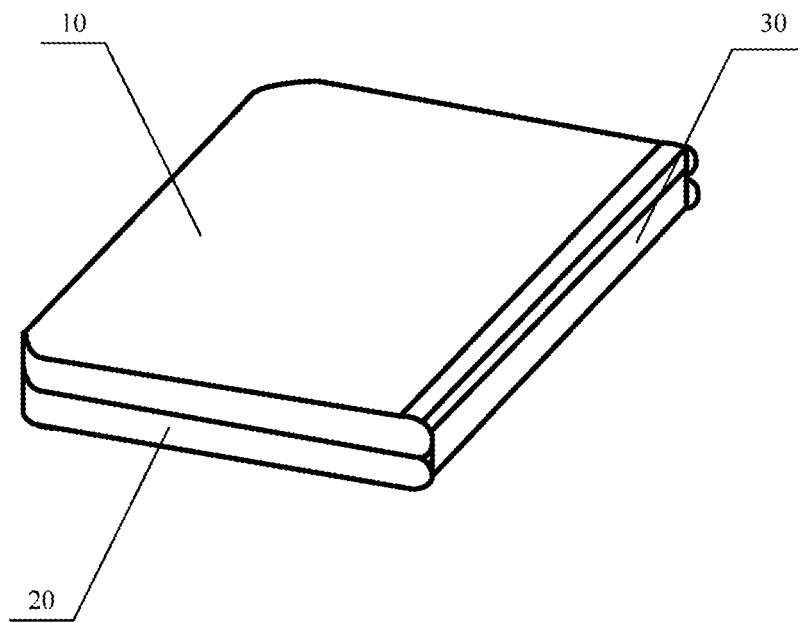
FIG. 1 is a schematic structural diagram of a foldable display apparatus in an inward folded state provided by an embodiment of the present disclosure.

The embodiments of the present disclosure will be described in detail below with reference to the drawings. The embodiments in the present disclosure and features in the embodiments may be combined randomly with each other if there is no conflict.

The present disclosure describes multiple embodiments, but the description is exemplary rather than restrictive. For those of ordinary skill in the art, there may be more embodiments and implementations in the scope of the embodiments described in the present disclosure. Although many possible combinations of features are shown in the drawings and discussed in the detailed description, many other combinations of the disclosed features are also possible. Unless expressly limited, any feature or element of any embodiment may be used in combination with, or may replace, any other feature or element in any other embodiment.

The present disclosure includes and conceives combinations with the features and elements known to those of ordinary skills in the art. The embodiments, features and elements that have been disclosed in the present disclosure may also be combined with any conventional features or elements to form technical solutions defined by the claims. Any features or elements of any embodiment may also be combined with features or elements from other technical solutions to form another technical solution defined by the claims. Therefore, it should be understood that any of the features shown and discussed in the present disclosure may be implemented individually or in any suitable combination. Therefore, the embodiments are not to be limited except the limitation by the appended claims and equivalents thereof. Furthermore, various modifications and variations may be made within the scope of the appended claims.

Unless otherwise defined, technical terms or scientific terms used in the present disclosure shall have common meanings as construed by those of ordinary skills in the art to which the present disclosure pertains. The "first", "second" and similar terms used in the present disclosure do not indicate any order, number, or importance, but are used only for distinguishing different components. Terms such as "include" or "contain" mean that an element or an object appearing before the term includes elements or objects listed after the term or their equivalents and does not exclude other elements or objects. Terms such as "connect" or "join" are not limited to physical or mechanical connection, but may include electrical connection, whether direct or indirect. "Upper", "lower", "left", "right", etc., only indicate relative position relationships, which may be changed accordingly when an absolute position of a described object is changed.

In a foldable display apparatus, a rotating shaft protection member may be made of a metal or a plastic material. However, the rotating shaft protection member made of the metal or the plastic material can only realize 180-degree folding, but cannot realize 360-degree folding. In order to realize 360-degree folding of the foldable display apparatus, the rotating shaft protection member in the foldable display apparatus may be made of a flexible material such as a soft glue, but the rotating shaft protection member made of the soft glue is prone to softly collapse. When the foldable display apparatus is in a bending process, and when the pressure is too large, the rotating shaft protection member made of the soft glue cannot play a protective role, so that partial parts of the foldable display apparatus are damaged, reducing the service life of the foldable display apparatus.

Figure 2:
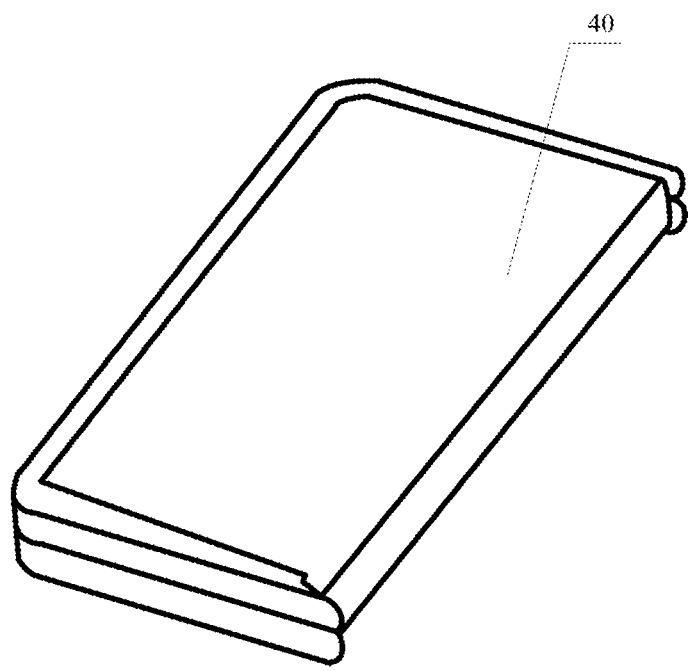
FIG. 2 is a schematic structural diagram of a foldable display apparatus in an outward folded state provided by an embodiment of the present disclosure.

FIG. 1 is a structural schematic diagram of a foldable display apparatus in an inward folded state provided by an embodiment of the present disclosure, and FIG. 2 is a structural schematic diagram of a foldable display apparatus in an outward folded state provided by an embodiment of the present disclosure. As shown in FIG. 1, the foldable display apparatus provided by the embodiment of the present disclosure includes a first shell 10, a second shell 20, a rotating shaft assembly (not shown in the figure), and a rotating shaft protection member 30. The rotating shaft assembly is located between the first shell 10 and the second shell 20, and is connected with the first shell 10 and the second shell 20, respectively. The rotating shaft protection member 30 covers the rotating shaft assembly.

The rotating shaft protection member is made of a shape-memory alloy. Herein, the shape-memory alloy is a kind of alloy material which may completely eliminate deformation which occurs and restore its original shape before the deformation, that is, an alloy having "memory" effect.

In an exemplary embodiment, as shown in FIG. 2, the foldable display apparatus provided by the embodiment of the present disclosure may further include a flexible display assembly 40.

In an exemplary embodiment, the flexible display assembly 40 may be stacked on the first shell 10, the second shell 20, and the rotating shaft assembly to support the flexible display assembly through the first shell 10, the second shell 20, and the rotating shaft assembly.

In an exemplary embodiment bent states of the foldable display apparatus include an inward folded state and an outward folded state. Herein, the outward folded state refers to that the flexible display assembly is on the outside after the foldable display apparatus is bent; on the contrary, the inward folded state refers to that the flexible display assembly is on the inside after the foldable display apparatus is bent, so as to effectively protect the flexible display assembly from external impact when the flexible display assembly is in the bent state, reducing the lose effectiveness risk of the flexible display assembly. The foldable display apparatus provided by the present embodiment may realize 360-degree folding.

In an exemplary embodiment, the bending of the foldable display equ may be realized by achieving relative rotation of the first shell 10 and the second shell 20 through the rotating shaft assembly.

In an exemplary embodiment, by wrapping the rotating shaft assembly by the rotating shaft protection member 30, it may be avoided that the rotating shaft assembly is directly exposed to the outside, thereby improving the appearance effect of the foldable display apparatus, and it may be avoided that external impurities enter the rotating shaft assembly or enter the inside of the foldable display apparatus through the rotating shaft assembly, thereby ensuring the quality of the foldable display apparatus. At the same time, it may be also avoided that a user is pinched when the rotating shaft assembly is bent.

In an exemplary embodiment, the rotating shaft protection member 30 is bent with the bending of the rotating shaft assembly, thereby avoiding the influence of the rotating shaft protection member 30 on the foldable display apparatus.

In an exemplary embodiment, the flexible display assembly 40 may be bent. Bending or flattening of the rotating shaft assembly may drive the flexible display assembly to bend or flatten.

A foldable display apparatus provided by an embodiment of the present disclosure includes a first shell, a second shell, a rotating shaft assembly, and a rotating shaft protection member; the rotating shaft assembly is located between the first shell and the second shell, and is respectively connected with the first shell and the second shell; the rotating shaft protection member covers the rotating shaft assembly; the rotating shaft protection member is made of a shape-memory alloy. The rotating shaft protection member in the technical proposal provided by the present disclosure is made of a shape-memory alloy, which may improve the supporting property of the rotating shaft protection member, avoid the damage to partial parts of the foldable display apparatus caused by the relatively large pressure when the foldable display apparatus is bent, and prolong the service life of the foldable display apparatus.

In an exemplary embodiment, as shown in FIG. 1, when the foldable display apparatus is in the inward folded state, the rotating shaft protection member 30 is not subjected to any squeeze.

In an exemplary embodiment, as shown in FIG. 2, when the foldable display apparatus is in the outward folded state, the rotating shaft protection member 30 is squeezed by the first shell 10 and the second shell 20, at which time the rotating shaft protection member is wrapped by the flexible display assembly, the first shell, and the second shell.

In an exemplary embodiment, when the foldable display apparatus is in different bent states, the rotating shaft protection members assumes different bulk phase states.

In an exemplary embodiment, the bulk phase states include an austenitic phase and a martensitic phase. Herein, the austenitic phase has characteristics of certain rigidity and relatively stable shape, while the martensitic phase has characteristics of certain ductility and easy deformation.

In an exemplary embodiment, when the bent state of the foldable display apparatus is in the inward folded state, the rotating shaft protection member assumes the austenitic phase. When the bent state of the foldable display apparatus is in the inward folded state, the rotating shaft protection member assuming the austenitic phase has characteristics of certain rigidity and supporting property, so that the rotating shaft protection member may effectively protect the rotating shaft assembly, avoid the damage of partial parts of the foldable display apparatus, and prolong the service life of the foldable display apparatus.

In an exemplary embodiment, when the bent state of the foldable display apparatus is the outward folded state, the rotating shaft protection member assumes the martensitic phase. When the bent state of the foldable display apparatus is the outward folded state, the rotating shaft protection member assuming the martensitic phase has characteristics of certain ductility and easy deformation, so that the rotating shaft protection member may bear the squeezing from the flexible display assembly, the first shell 10, and the second shell 20, which may effectively protect the rotating shaft protection member, avoid the damage of partial parts of the foldable display apparatus, and prolong the service life of the foldable display apparatus.

In an exemplary embodiment, the shape-memory alloy may include an iron-nickel alloy material or a titanium-nickel alloy material.

In an exemplary embodiment, the rotating shaft protection member is made of the shape-memory alloy. When the bent state of the foldable display apparatus is changed, that is, when the bent state is changed from the inward folded state to the outward folded state, pressure is applied to the rotating shaft protection member, when the bent state is changed from the outward folded state to the inward folded state, the pressure on the rotating shaft protection member is removed. By applying and removing the pressure, the shape-memory alloy may be activated to change from the austenitic phase to the martensitic phase or from the martensitic phase to the austenitic phase, and this change is reversible.

In an exemplary implementation, the flexible display assembly includes a display surface and a non-display surface disposed oppositely. The first shell, the second shell, and the rotating shaft assembly are positioned on the non-display surface of the flexible display assembly.

In an exemplary embodiment, the flexible display assembly may include a display panel itself that may display a picture.

In an exemplary embodiment, the display panel may be a flexible liquid crystal display panel, or a flexible organic light emitting diode display panel.

In an exemplary embodiment, the flexible display assembly may also include another film layer or base material, such as a cover plate, a substrate, an optical glue, a polarizing layer, or a phase film, that is attached to the display panel.

In an exemplary embodiment, the flexible display assembly may include a display region itself, or may include a frame region around the display region, a glue encapsulation region between the display region or the frame region and the first shell 10 and the second shell 20.

In an exemplary embodiment, the flexible display assembly may be an integral whole or may be composed of two display assemblies.

Figure 3:
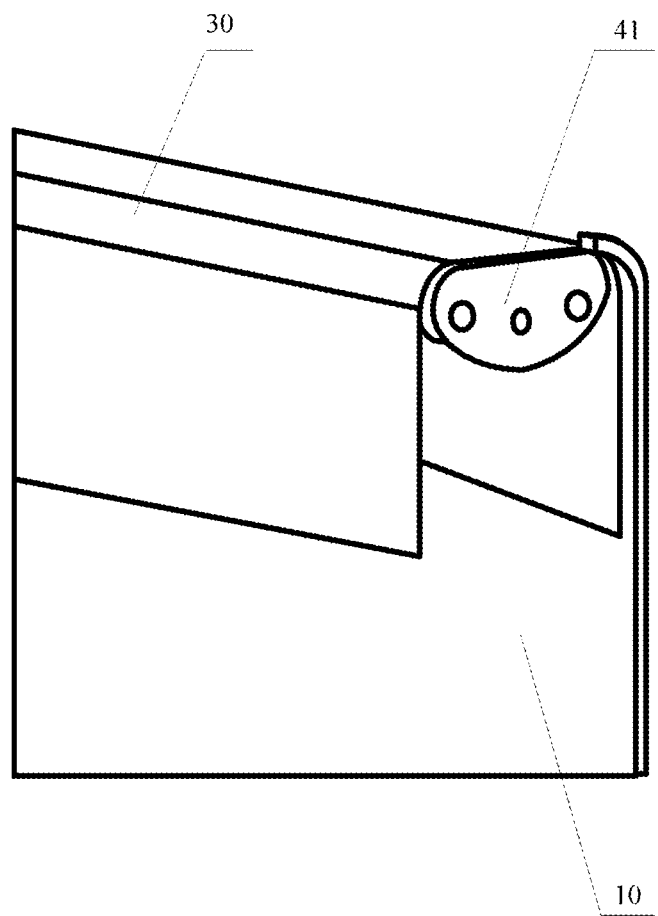
FIG. 3 is a side view of a foldable display apparatus in an inward folded state provided by an exemplary embodiment.
Figure 4:
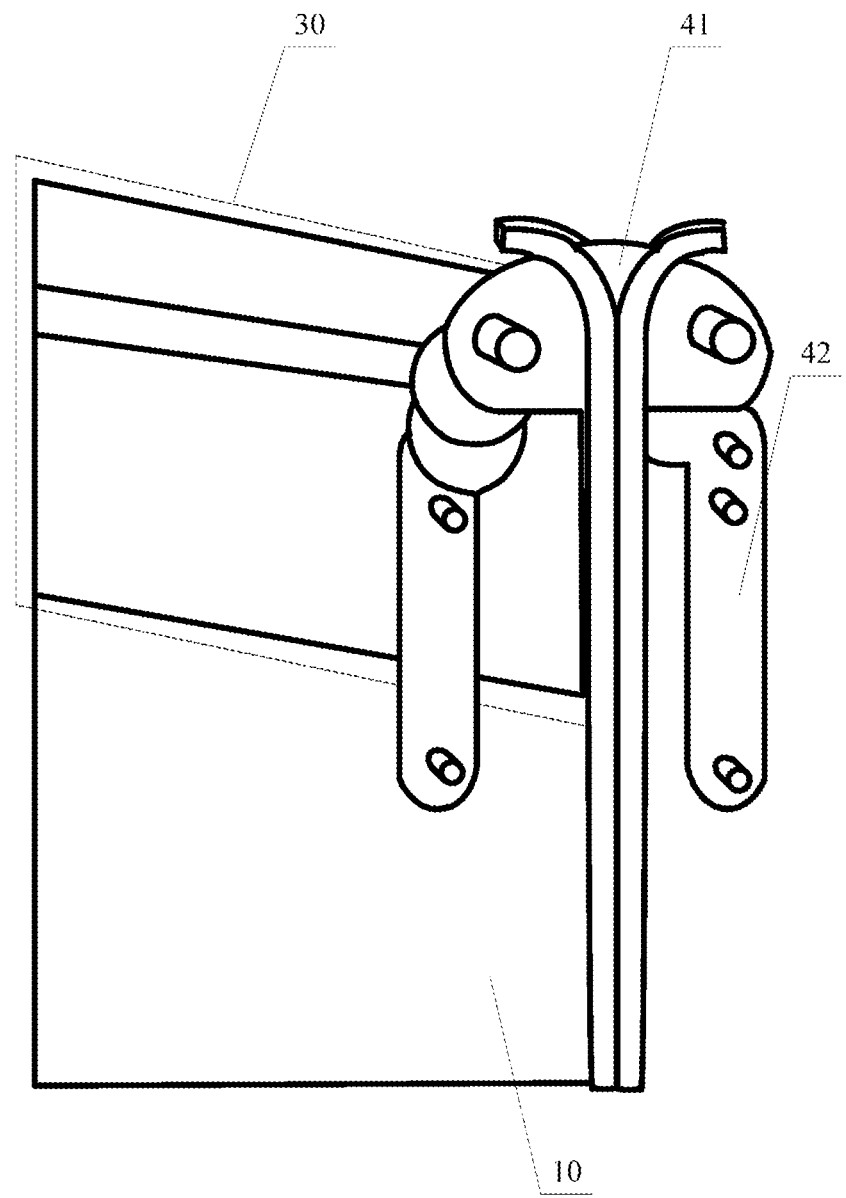
FIG. 4 is a side view of a foldable display apparatus in an outward folded state provided by an exemplary embodiment.

FIG. 3 is a side view of a foldable display apparatus in an inward folded state provided by an exemplary embodiment, and FIG. 4 is a side view of a foldable display apparatus in an outward folded state provided by an exemplary embodiment. As shown in FIGS. 3 and 4, the rotating shaft protection member 30 is adhesively connected with each of the first shell 10 and the second shell 20.

In an exemplary embodiment, the rotating shaft protection member 30 is adhesively connected with each of the first shell 10 and the second shell 20 by a colloid.

In an exemplary embodiment, as in FIGS. 3 and 4, the rotating shaft assembly may include a center beam structure 41 and an auxiliary structure 42 connected with the center beam structure 41. The rotating shaft protection member covers the center beam structure 41, and a shape of the rotating shaft protection member is adapted to a shape of the center beam structure.

In an exemplary embodiment, the rotating shaft assembly may include at least one bending shaft, wherein the rotating shaft assembly is folded with the bending shaft. The bending shaft is not limited to the actual existence of the solid shaft, but also may be a virtual shaft, that is, as long as the rotating shaft assembly is bent around a certain shaft, it may be considered as the bending shaft.

In an exemplary embodiment, the rotating shaft assembly may include at least two rotating shafts, two adjacent rotating shafts are connected by the bending shaft, such that the rotating shaft assembly rotates by taking the bending shaft, at a position where the adjacent two rotating shafts are connected, as a shaft.

In an exemplary embodiment, when the foldable display apparatus is in a bent state, the rotating shaft protection member assumes a U-shaped structure.

Figure 5:
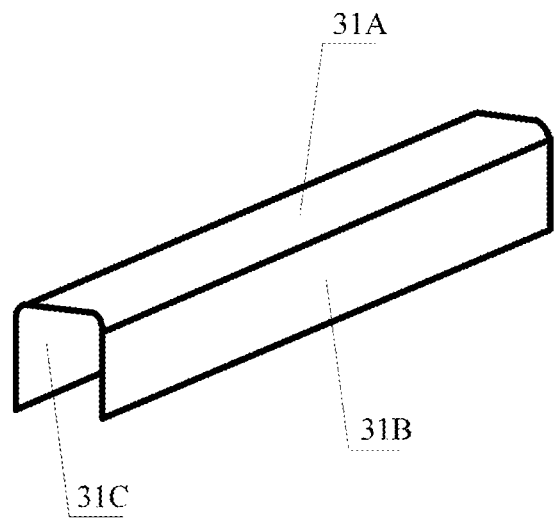
FIG. 5 is a first side view of a rotating shaft protection member in an inward folded state provided by an exemplary embodiment.
Figure 6:
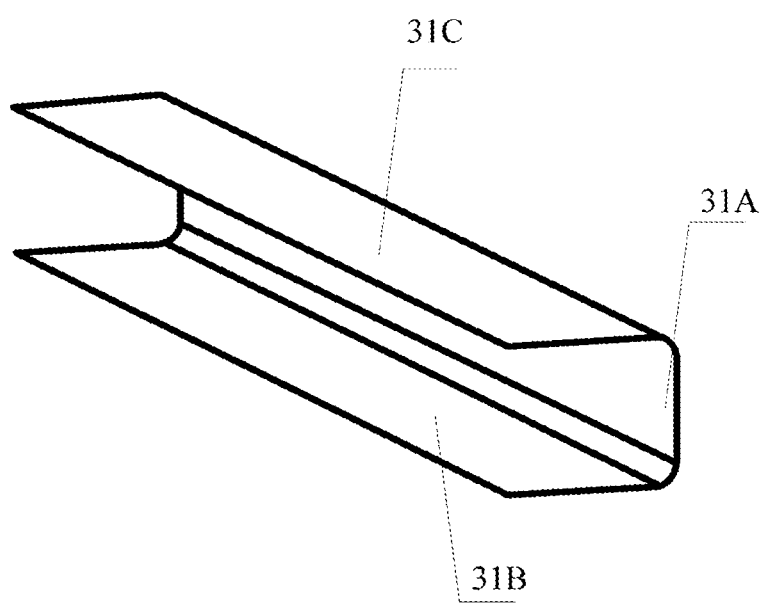
FIG. 6 is a second side view of a rotating shaft protection member in an inward folded state provided by an exemplary embodiment.
Figure 7:
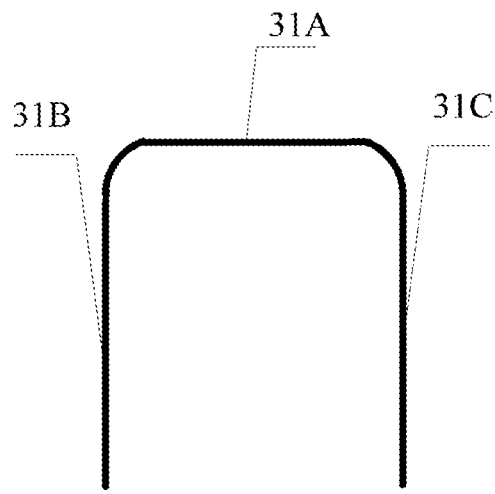
FIG. 7 is a cross-sectional view of a rotating shaft protection member in an inward folded state provided by an exemplary embodiment.

FIG. 5 is a first side view of a rotating shaft protection member in an inward folded state provided by an exemplary embodiment, FIG. 6 is a second side view of a rotating shaft protection member in an inward folded state provided by an exemplary embodiment, and FIG. 7 is a cross-sectional view of a rotating shaft protection member in an inward folded state provided by an exemplary embodiment. As shown in FIGS. 5 to 7, when the foldable display apparatus is in an inward folded state, the rotating shaft protection member assumes a U-shaped structure.

In an exemplary embodiment, as shown in FIGS. 5 to 7, when the foldable display apparatus is in an inward folded state, the rotating shaft protection member includes a first bent part 31A, a first non-bent part 31B, and a second non-bent part 31C. The first non-bent part 31B and the second non-bent part 31C are respectively positioned on both sides of the first bent part 31A, and are disposed in parallel.

Figure 8:
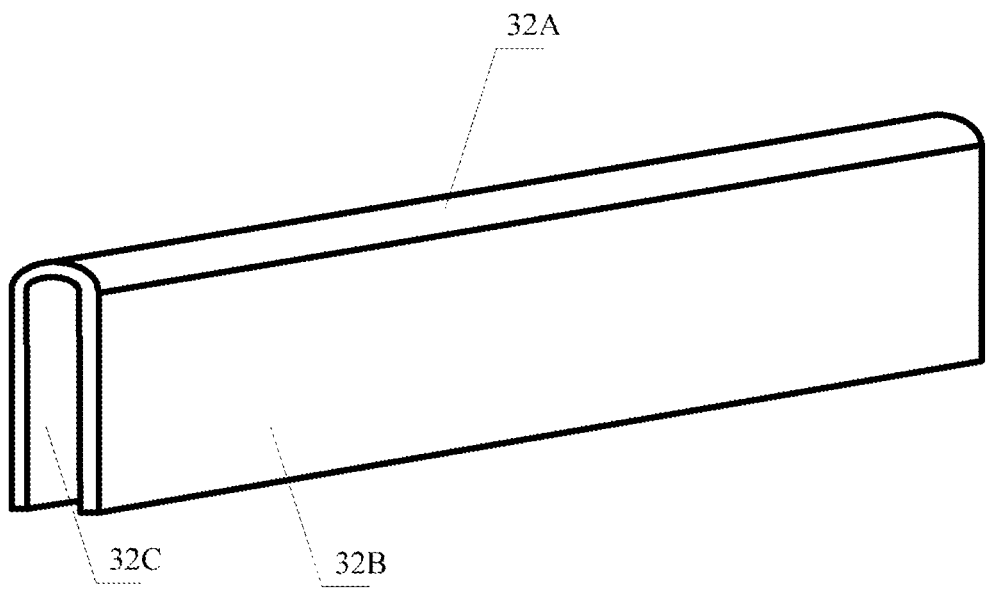
FIG. 8 is a side view of a rotating shaft protection member in an outward folded state provided by an exemplary embodiment.
Figure 9:
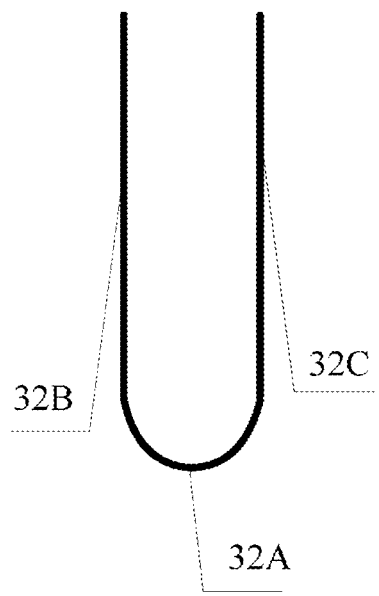
FIG. 9 is a cross-sectional view of a rotating shaft protection member in an outward folded state provided by an exemplary embodiment.

FIG. 8 is a side view of a rotating shaft protection member in an outward folded state provided by an exemplary embodiment, and FIG. 9 is a cross-sectional view of a rotating shaft protection member in an outward folded state provided by an exemplary embodiment. As shown in FIGS. 8 and 9, when the foldable display apparatus is in an outward folded state, the rotating shaft protection member assumes a U-shaped structure.

In an exemplary embodiment, as shown in FIGS. 8 and 9, when the foldable display apparatus is in an outward folded state, the rotating shaft protection member includes a second bent part 32A, a third non-bent part 32B, and a fourth non-bent part 32C; the third non-bent part 32B and the fourth non-bent part 32C are respectively positioned on both sides of the second bent part 32A, and are disposed in parallel.

In an exemplary embodiment, since the pressure borne by the rotating shaft protection member when the foldable display apparatus is in the outward folded state is greater than the pressure borne by the rotating shaft protection member when the foldable display apparatus is in the inward folded state, and confined to a spatial structure of the rotating shaft assembly when the foldable display apparatus is in the outward folded state, a bending degree of the first bent part 31A is smaller than a bending degree of the second bent part 32A, and a distance between the first non-bent part 31B and the second non-bent part 31C is larger than a distance between the third non-bent part 32B and the fourth non-bent part 32C.

When the foldable display apparatus is in the inward folded state, the rotating shaft protection member is free from external force, at which time the rotating shaft protection member is in an elastic natural state, has certain rigidity and supporting property, assumes the shape shown in FIGS. 5 to 7, and may protect parts of the rotating shaft assembly. When the foldable display apparatus is changed from the inward folded state to the outward folded state, the second bent part of the rotating shaft protection member bears pressure, the bulk phase state of the rotating shaft protection member changes, an internal molecular spacing of the rotating shaft protection member is reduced, and the rotating shaft protection member is squeezed to assume the shape shown in FIGS. 8 and 9, and curled up between the two shells and the flexible display assembly, at which time, the rotating shaft protection member is easy to deform and has ductility, which may ensure that the rotating shaft protection member will not softly collapse when the foldable display apparatus is in the outward folded state. When the foldable display apparatus is changed from the outward folded state to the inward folded state, the rotating shaft protection member is no longer stressed, and is straightened by its own elastic force to return to the elastic natural state.

In an exemplary embodiment, a shape of the rotating shaft protection member is adapted to a shape of the center beam structure.

In an exemplary embodiment, the rotating shaft protection member may be in a solid structure. FIGS. 5 to 9 illustrate an example in which the rotating shaft protection member is in the solid structure.

In an exemplary embodiment, the rotating shaft protection member may be in a hollow structure. The rotating shaft protection member in the hollow structure is beneficial to the deformation of the rotating shaft protection member.

Figure 10:
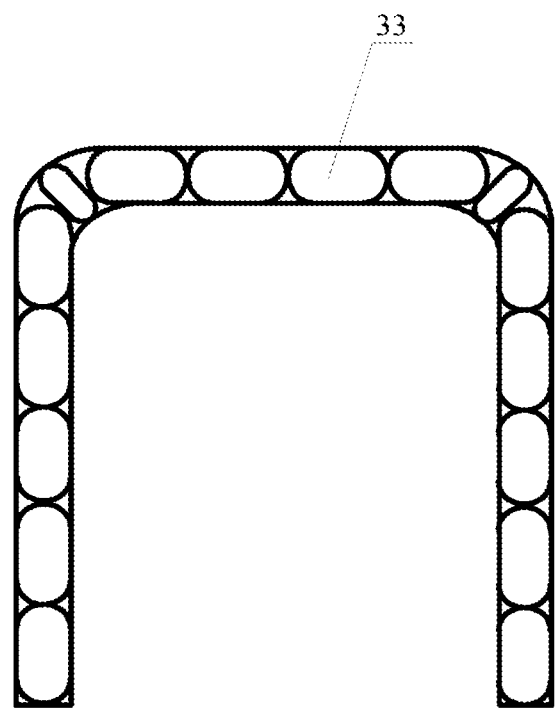
FIG. 10 is a first cross-sectional view of a rotating shaft protection member in an inward folded state provided by an exemplary embodiment.
Figure 11:
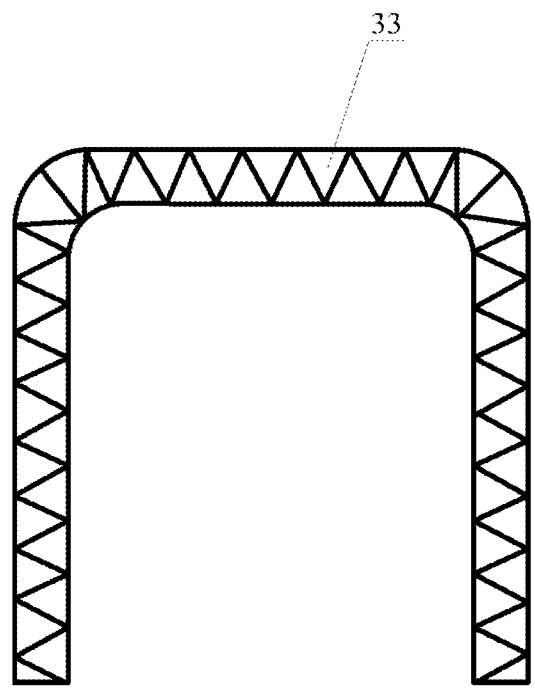
FIG. 11 is a second cross-sectional view of a rotating shaft protection member in an inward folded state provided by an exemplary embodiment.
Figure 12:
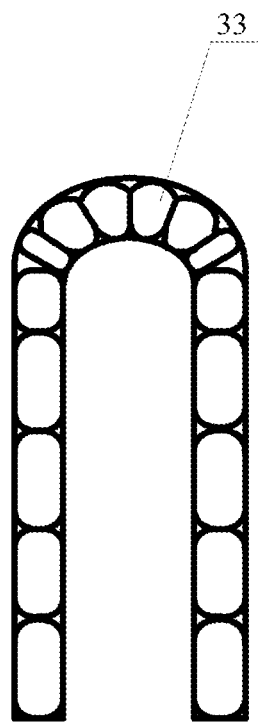
FIG. 12 is a first cross-sectional view of a rotating shaft protection member in an outward folded state provided by an exemplary embodiment.
Figure 13:
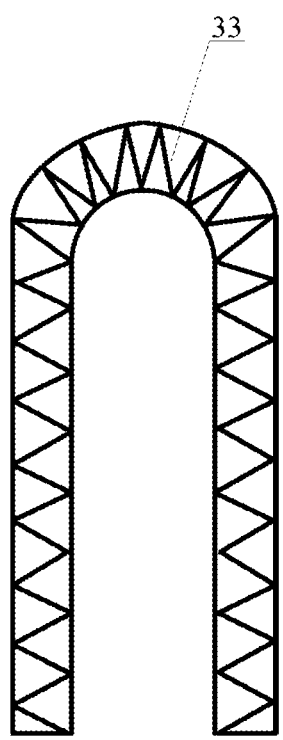
FIG. 13 is a second cross-sectional view of a rotating shaft protection member in an outward folded state provided by an exemplary embodiment.

FIG. 10 is a first cross-sectional view of a rotating shaft protection member in an inward folded state provided by an exemplary embodiment, FIG. 11 is a second cross-sectional view of a rotating shaft protection member in an inward folded state provided by an exemplary embodiment, FIG. 12 is a first cross-sectional view of a rotating shaft protection member in an outward folded state provided by an exemplary embodiment, and FIG. 13 is a second cross-sectional view of a rotating shaft protection member in an outward folded state provided by an exemplary embodiment. In an exemplary embodiment the rotating shaft protection member 30 includes multiple tube bodies 33 connected with each other. At least one tube body is in a hollow structure.

In an exemplary embodiment, multiple tube bodies may be in an integrally molded structure.

In an exemplary embodiment, the rotating shaft protection member 30 may be formed by stacking multiple tube bodies.

In an exemplary embodiment, a cross-sectional shape of the at least one tube body includes one of a triangle, a rectangle, a trapezoid, or a ring consisting of two semicircles and two straight lines. Herein, the triangle may be a long waist triangle, the rectangle may be a long waist rectangle, and the trapezoid may be a long waist trapezoid. FIG. 10 and FIG. 12 illustrate an example in which the cross-sectional shape of the at least one tube body is the ring consisting of two semicircles and two straight lines, and FIG. 11 and FIG. 13 illustrate an example in which the cross-sectional shape of the at least one tube body is the triangle.

In an exemplary embodiment, the cross-sectional shapes of all the tube bodies in the rotating shaft protection member may be same, or may be different. FIG. 10 to FIG. 13 illustrate an example in which the cross-sectional shapes of all the tube bodies in the rotating shaft protection member are same.

When the foldable display apparatus changes from the inward folded state to the outward folded state, the rotating shaft protection member changes from the austenitic phase to the martensitic phase having ductility, at which time, the second bent part of the rotating shaft protection member is stressed, inside space of the bent part of the rotating shaft protection member is compressed, a length is changed, and the tube body in the hollow structure is compressed into the shape shown in FIGS. 11 and 13. The third non-bent part and the fourth non-bent part of the rotating shaft protection member do not have space compression.

An embodiment of the present disclosure also provides an electronic device, including a foldable display apparatus.

In an exemplary implementation, the electronic device may be a mobile phone, a tablet, an e-reader, a computer, or an electronic display screen.

The foldable display apparatus is the foldable display apparatus provided by any one of the aforementioned embodiments, and has similar implementation principle and implementation effects, which will not be repeated here again.

The accompanying drawings of the present disclosure only involve the structures involved in the embodiments of the present disclosure, and the other structures may refer to conventional designs.

For the sake of clarity, in the accompanying drawings used to describe the embodiments of the present disclosure, the thickness and dimension of a layer or a micro structure is enlarged. It is to be understood that when an element such as a layer, a film, a region, or a substrate is called as being "on" or "under" another element, it may be "directly" positioned "on" or "under" the another element, or an intermediate element may exist.

Although the embodiments disclosed in the present disclosure are as above, the described contents are only embodiments used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A foldable display apparatus, comprising: a first shell, a second shell, a rotating shaft assembly, and a rotating shaft protection member; wherein
the rotating shaft assembly is located between the first shell and the second shell, and is connected to each of the first shell and the second shell;
the rotating shaft protection member covers the rotating shaft assembly; and
the rotating shaft protection member is made of a shape-memory alloy;
wherein bent states of the foldable display apparatus comprise: an inward folded state and an outward folded state; and
when the foldable display apparatus is in different bent states, the rotating shaft protection member assumes different bulk phase states;
wherein the bulk phase states comprise an austenitic phase and a martensitic phase;
when the bent state of the foldable display apparatus is the inward folded state, the rotating shaft protection member assumes the austenitic phase; and
when the bent state of the foldable display apparatus is the outward folded state, the rotating shaft protection member assumes the martensitic phase.

2. The apparatus of claim 1, wherein the shape-memory alloy comprises an iron-nickel alloy material or a titanium-nickel alloy material.

3. The apparatus of claim 2, further comprising: a flexible display assembly; wherein
the flexible display assembly comprises: a display surface and a non-display surface disposed oppositely; and
the first shell, the second shell, and the rotating shaft assembly are positioned on the non-display surface of the flexible display assembly.

4. The apparatus of claim 2, wherein the rotating shaft protection member is adhesively connected with each of the first shell and the second shell.

5. The apparatus of claim 1, wherein the rotating shaft protection member is in a solid structure.

6. The apparatus of claim 1, wherein the rotating shaft protection member is in a hollow structure.

7. The apparatus of claim 6, wherein
the rotating shaft protection member comprises: a plurality of tube bodies connected with each other; and
at least one tube body is in a hollow structure.

8. The apparatus of claim 7, wherein the plurality of tube bodies are in an integrally molded structure.

9. The apparatus of claim 7, wherein a cross-sectional shape of the at least one tube body comprises one of a triangle, a rectangle, a trapezoid, or a ring consisting of two semicircles and two straight lines.

10. The apparatus of claim 9, wherein the cross-sectional shapes of all the tube bodies in the rotating shaft protection member are same.

11. An electronic device, comprising: the foldable display apparatus of claim 1.

12. The apparatus of claim 8, wherein a cross-sectional shape of the at least one tube body comprises one of a triangle, a rectangle, a trapezoid, or a ring consisting of two semicircles and two straight lines.

13. A foldable display apparatus, comprising: a first shell, a second shell, a rotating shaft assembly, and a rotating shaft protection member; wherein
the rotating shaft assembly is located between the first shell and the second shell, and is connected to each of the first shell and the second shell;
the rotating shaft protection member covers the rotating shaft assembly; and
the rotating shaft protection member is made of a shape-memory alloy;
wherein when the foldable display apparatus is in a bent state, the rotating shaft protection member assumes a U-shaped structure;

wherein when the foldable display apparatus is in an inward folded state, the rotating shaft protection member comprises a first bent part, a first non-bent part, and a second non-bent part;

the first non-bent part and the second non-bent part are respectively positioned on two sides of the first bent part, and are disposed in parallel;

when the foldable display apparatus is in an outward folded state, the rotating shaft protection member comprises a second bent part, a third non-bent part, and a fourth non-bent part;

the third non-bent part and the fourth non-bent part are respectively positioned on two sides of the second bent part, and are disposed in parallel;

a bending degree of the first bent part is smaller than a bending degree of the second bent part; and a distance between the first non-bent part and the second non-bent part is greater than a distance between the third non-bent part and the fourth non-bent part.

14. The apparatus of claim 13, wherein
the rotating shaft assembly comprises: a center beam structure; and
the rotating shaft protection member covers the center beam structure, and a shape of the first bent part of the rotating shaft protection member is adapted to a shape of the center beam structure.

15. The apparatus of claim 13, wherein the shape-memory alloy comprises an iron-nickel alloy material or a titanium-nickel alloy material.

16. The apparatus of claim 15, further comprising: a flexible display assembly; wherein
the flexible display assembly comprises: a display surface and a non-display surface disposed oppositely; and
the first shell, the second shell, and the rotating shaft assembly are positioned on the non-display surface of the flexible display assembly.

17. The apparatus of claim 15, wherein the rotating shaft protection member is adhesively connected with each of the first shell and the second shell.

18. The apparatus of claim 13, wherein the rotating shaft protection member is in a solid structure.

19. The apparatus of claim 13, wherein the rotating shaft protection member is in a hollow structure.

20. An electronic device, comprising: the foldable display apparatus of claim 13.

* * * * *